(12) United States Patent
Chien et al.

(10) Patent No.: US 11,378,894 B2
(45) Date of Patent: *Jul. 5, 2022

(54) LITHOGRAPHY SYSTEM WITH AN EMBEDDED CLEANING MODULE

(71) Applicant: Taiwan Semiconductor Manufacturing Company, Ltd., Hsin-Chu (TW)

(72) Inventors: Shang-Chieh Chien, Taipei (TW); Jeng-Horng Chen, Hsin-Chu (TW); Jui-Ching Wu, Hsinchu (TW); Chia-Chen Chen, Hsinchu (TW); Hung-Chang Hsieh, Hsin-Chu (TW); Chi-Lun Lu, Hsinchu (TW); Chia-Hao Yu, Hsinchu (TW); Shih-Ming Chang, Hsinchu County (TW); Anthony Yen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/665,585

(22) Filed: Oct. 28, 2019

(65) Prior Publication Data

US 2020/0064747 A1 Feb. 27, 2020

Related U.S. Application Data

(63) Continuation of application No. 14/168,114, filed on Jan. 30, 2014, now Pat. No. 10,459,353.

(60) Provisional application No. 61/793,838, filed on Mar. 15, 2013.

(51) Int. Cl.
G03F 7/20 (2006.01)

(52) U.S. Cl.
CPC ...... *G03F 7/70925* (2013.01); *G03F 7/70741* (2013.01)

(58) Field of Classification Search
CPC .................. G03F 7/70925; G03F 7/70741
See application file for complete search history.

(56) References Cited

U.S. PATENT DOCUMENTS

| | | | |
|---|---|---|---|
| 4,744,833 A | 5/1988 | Cooper et al. |
| 5,634,230 A | 6/1997 | Maurer |
| 5,690,749 A | 11/1997 | Lee |
| 6,776,171 B2 | 8/2004 | Carpenter et al. |
| 7,070,832 B2 | 7/2006 | Goldstein |
| 9,034,467 B2 | 5/2015 | Itoh et al. |
| 9,093,481 B2 | 7/2015 | Levinson |
| 2002/0023307 A1 | 2/2002 | Haba et al. |

(Continued)

FOREIGN PATENT DOCUMENTS

| | | |
|---|---|---|
| CN | 202649668 U | 1/2013 |
| JP | 2002139825 A | 5/2002 |

(Continued)

*Primary Examiner* — Deoram Persaud
(74) *Attorney, Agent, or Firm* — Haynes and Boone, LLP

(57) ABSTRACT

The present disclosure provides a lithography system. The lithography system includes an exposing module configured to perform a lithography exposing process using a mask secured on a mask stage; and a cleaning module integrated in the exposing module and designed to clean at least one of the mask and the mask stage using an attraction mechanism.

20 Claims, 13 Drawing Sheets

(56) References Cited

U.S. PATENT DOCUMENTS

| | | | |
|---|---|---|---|
| 2003/0184720 | A1 | 10/2003 | Heerens et al. |
| 2006/0162739 | A1 | 7/2006 | Sogard |
| 2008/0024751 | A1 | 1/2008 | Hirayanagi |
| 2008/0117391 | A1 | 5/2008 | Onvlee et al. |
| 2009/0183322 | A1 | 7/2009 | Wu et al. |
| 2011/0159440 | A1 | 6/2011 | Nakajima et al. |
| 2011/0180108 | A1 | 7/2011 | Pan et al. |
| 2012/0024318 | A1 | 2/2012 | Itoh et al. |
| 2014/0232998 | A1* | 8/2014 | Sho ................. G03F 7/70741 355/30 |
| 2015/0241797 | A1 | 8/2015 | Onvlee et al. |

FOREIGN PATENT DOCUMENTS

| | | |
|---|---|---|
| JP | 2007212765 A | 8/2007 |
| KR | 20110061981 A | 6/2011 |
| TW | 201140672 A | 11/2011 |
| WO | 2013035415 A1 | 3/2013 |
| WO | WO 2014032887 A1 | 3/2014 |

\* cited by examiner

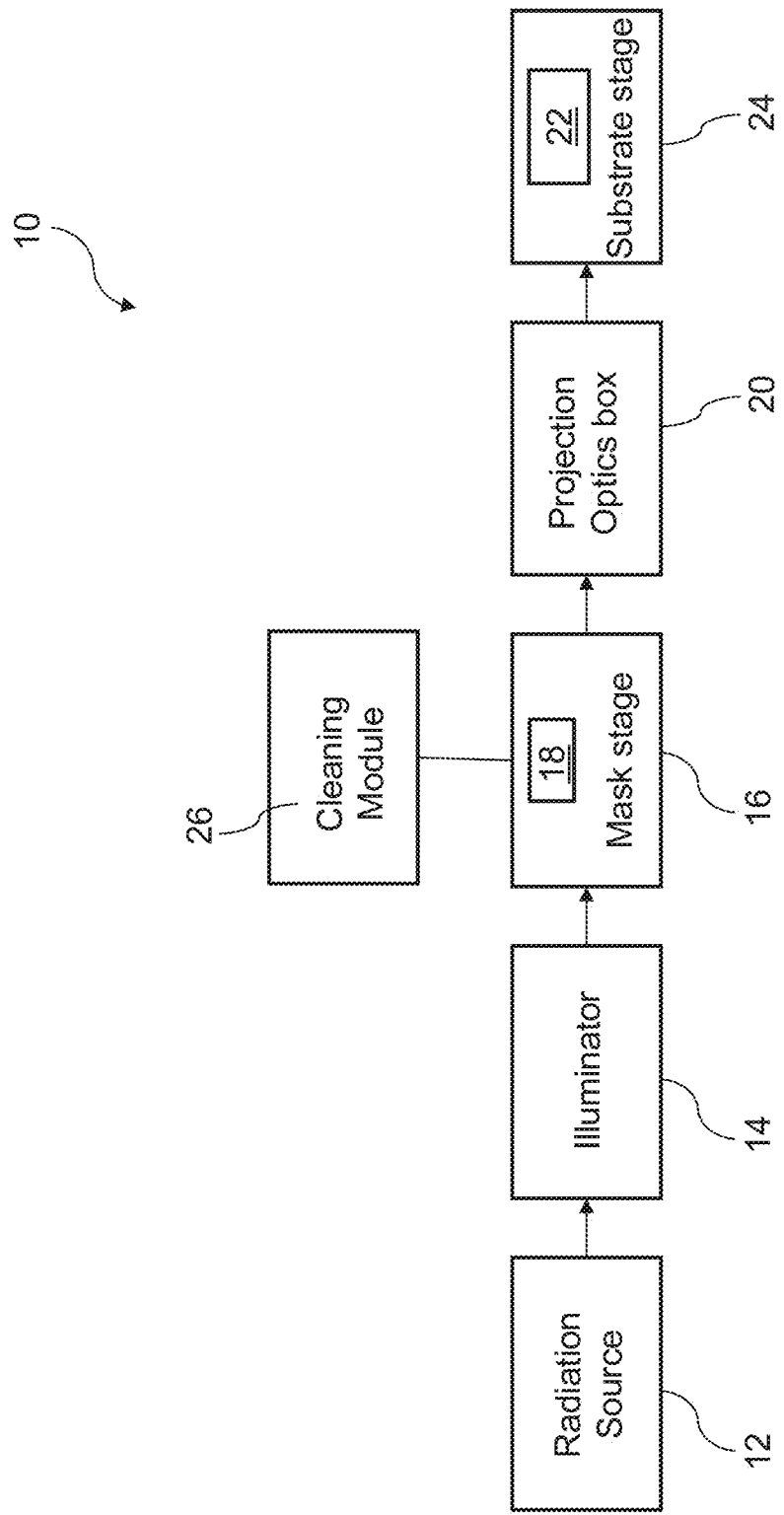

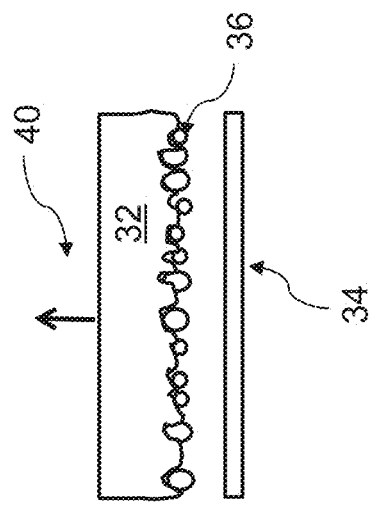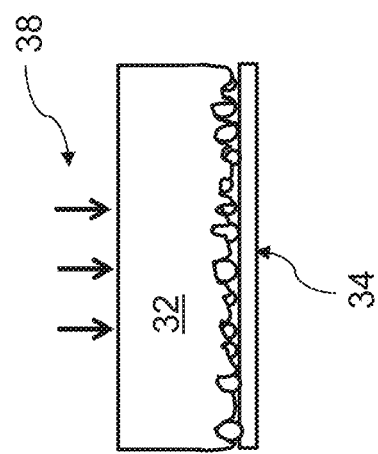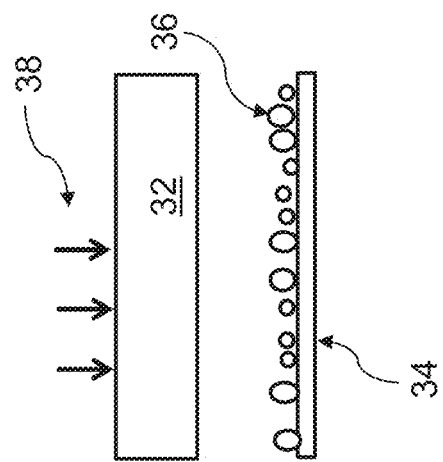

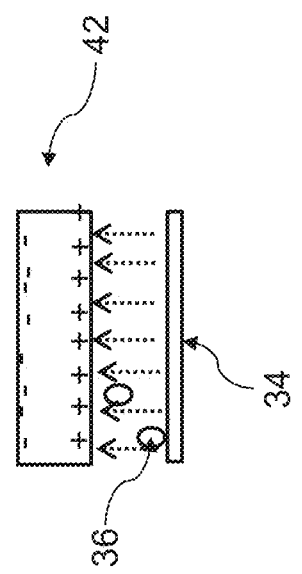

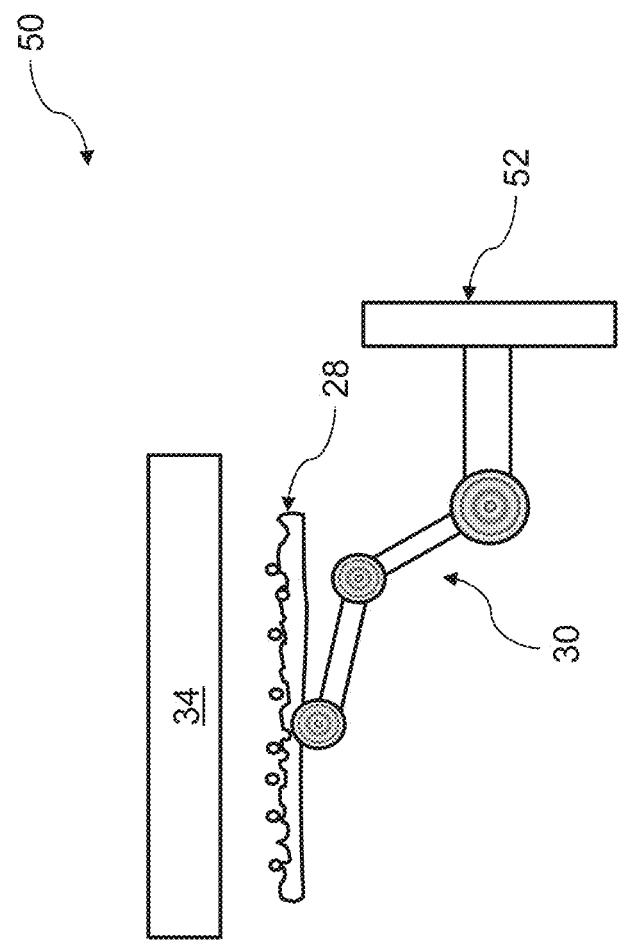

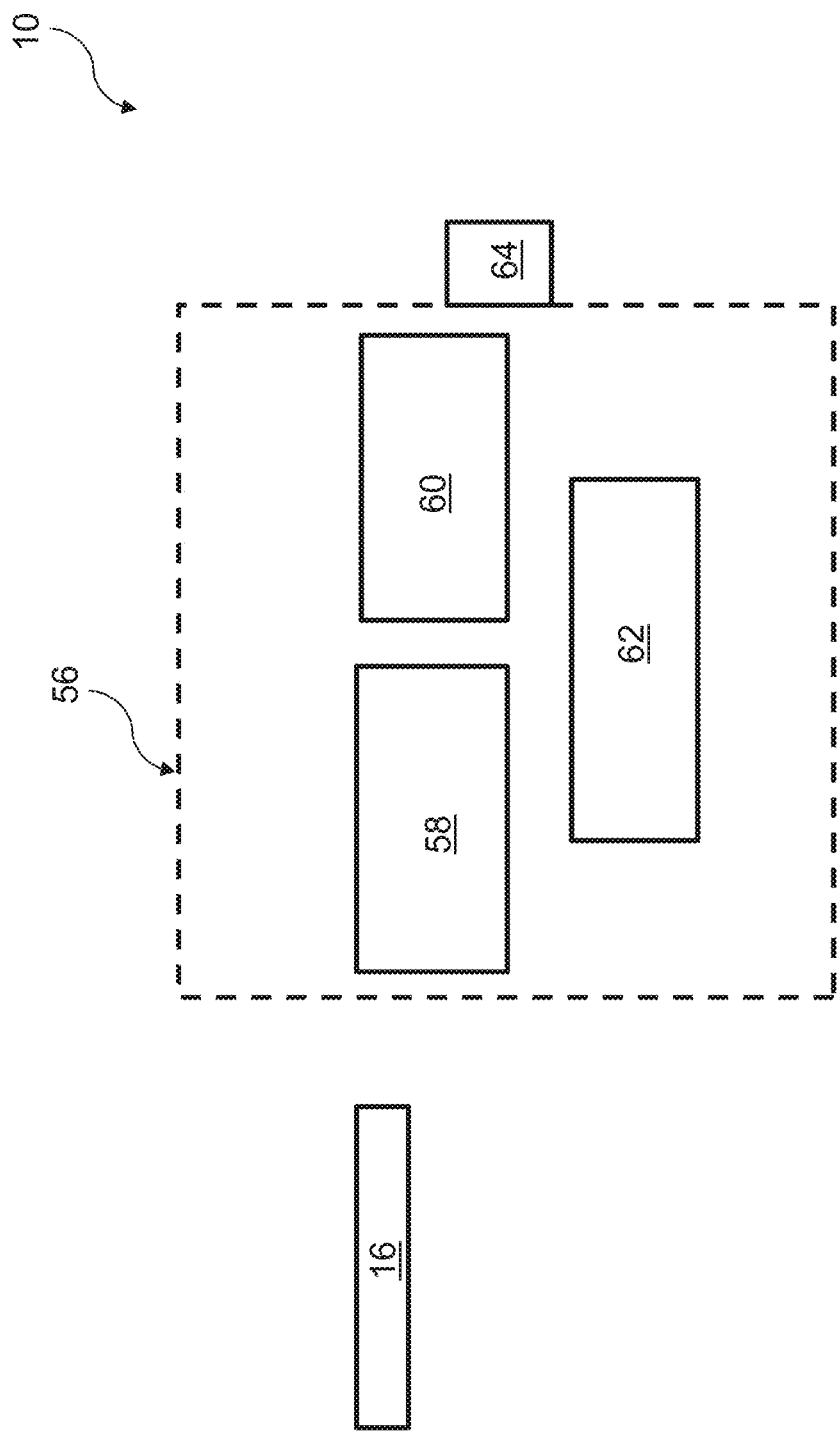

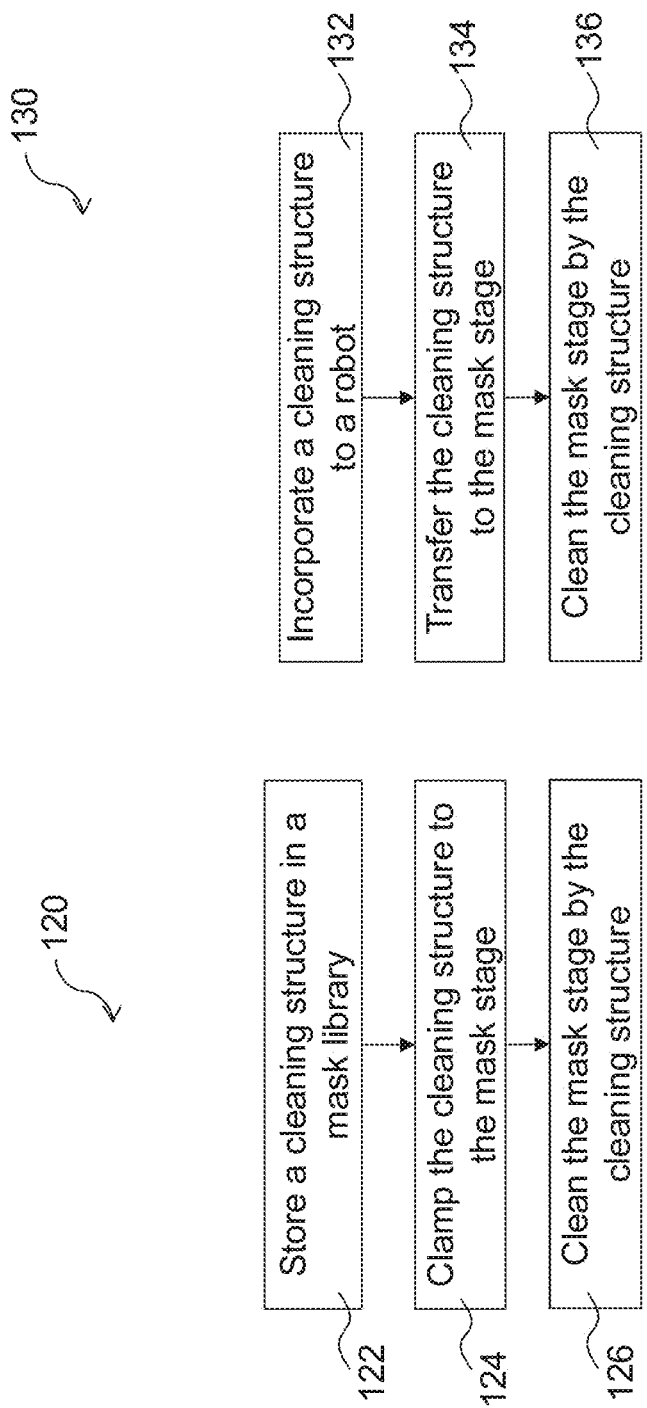

LITHOGRAPHY SYSTEM WITH AN EMBEDDED CLEANING MODULE

CROSS REFERENCE

The present application is a continuation of U.S. patent application Ser. No. 14/168,114, filed Jan. 30, 2014, now U.S. Pat. No. 10,459,353, issued Oct. 29, 2019, which is a utility application claiming the benefit of U.S. Provisional Application No. 61/793,838 entitled "AN EUV SCANNER WITH EMBEDDED CLEANING MODULE" filed Mar. 15, 2013, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example associated with lithography patterning, a photomask (or mask) to be used in a lithography process has a circuit pattern defined thereon and is to be transferred to wafers. In advanced lithography technologies, an extreme ultraviolet (EUV) lithography process is implemented with a reflective mask. The reflective mask needs to be cleaned to make the mask defect free.

The cleanliness of a lithography mask is essential in the yield of the lithography process. Operating or transporting a mask in a completely particle-free clean room and exposure tool is impossible. In other words, certain level of environmental nano-scale or macro-scale particles, which mainly are induced during transportation, could be directly adhered on back-side or front-side of the mask, thereby diminishing the cleanness of mask and mask stage. As a result, the yield of the lithography production is suffered due to non-cleaning mask. Therefore, how to effectively clean mask featuring closely damage-free is one major topic in the lithography process. In one example, the existing cleaning processes may cause various damages to the mask, or have high manufacturing cost. In another example, the existing cleaning processes could not effectively remove nano-scale particles. In yet another example, the existing cleaning method is complicated and is associated with high cost tool. In yet another example, additional particles could be further induced during the existing cleaning procedure. There are no effective clean method and system in the EUV lithography process. Vacuum technique cannot be used to clean inside the EUV lithography system.

Therefore, what is needed is a system and method to address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIG. 1 is a block diagram of a lithography system embedded with a cleaning module, constructed according to various embodiments.

FIGS. 4A through 4C illustrate schematic views of the cleaning module of FIG. 2 at respective cleaning stages, constructed according to other examples.

FIG. 5 is a schematic view of the cleaning module of FIG. 2, constructed according to another example.

FIGS. 7A and 7B are schematic views of the cleaning module of FIG. 2, constructed according to different examples.

FIGS. 8A and 8B are block diagrams of the lithography system of FIG. 1 embedded with the cleaning module, in portion, constructed according to respective embodiments.

FIG. 12 is a flowchart of a method for cleaning the mask stage of the lithography system, constructed according to some embodiments.

FIG. 13 is a flowchart of a method for cleaning the mask stage of the lithography system, constructed according to other embodiments.

DETAILED DESCRIPTION

Figure 3:
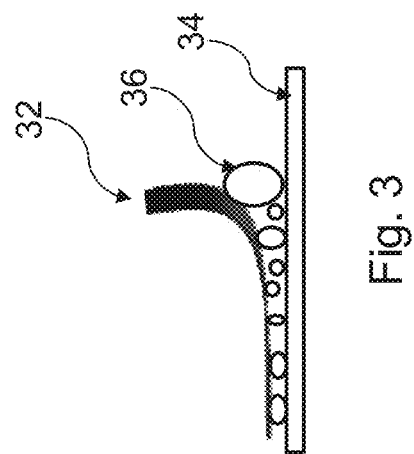
FIG. 3 is a schematic view of the cleaning module of FIG. 2, constructed according to one or more examples.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram of a lithography system 10 constructed according to aspects of the present disclosure in one or more embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light from the radiation source. The resist layer is a material sensitive to the EUV light. The EUV lithography system 10 employs a radiation source 12 to generate EUV light, such as EUV light having a wavelength ranging between about 1 nm and about 100 nm. In one particular example, the EUV radiation source 12 generates a EUV light with a wavelength centered at about 13.5 nm.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, reflective optics is employed.

The lithography system 10 also includes the mask stage 16 configured to secure a mask 18. In the present embodiment, the mask stage 16 includes an electrostatic chuck (e-chuck) to secure the mask 18. This is because that gas molecules absorb EUV light and the lithography system for the EUV lithography patterning is maintained in a vacuum environment to avoid the EUV intensity loss.

In the disclosure, the terms of mask, photomask, and reticle are used to refer to the same item. In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a target 22 (such as a semiconductor wafer) secured on a substrate stage 24 of the lithography system 10. The POB 20 has refractive optics (such as for UV lithography system) or alternatively reflective optics (such as for EUV lithography system) in various embodiments. The light directed from the mask 18, carrying the image of the pattern defined on the mask, is collected by the POB 20.

The lithography system 10 also includes the substrate stage 24 to secure a target 22. In the present embodiment, the target 22 is a semiconductor wafer, such as a silicon wafer or other type of wafer to be patterned. The target is coated with the resist layer sensitive to the radiation beam, such as EUV light in the present embodiment. In the present embodiment, various components, described above, are integrated together to function as a lithography exposing module that is operable to perform lithography exposing processes.

Particularly, the lithography system 10 includes a cleaning module 26 designed to clean the mask 18, the mask stage 16, or the both in various embodiments. The cleaning module 26 is embedded in the lithography system 10 and integrated with the lithography exposing module to enable on-line cleaning operations. The cleaning module 26 is designed to have an attraction mechanism for effectively cleaning the mask and/or mask stage without additional contamination/damage to the mask (or the mask stage) to be cleaned.

The lithography system 10 with embedded cleaning module 26 provides a system and a method for effectively cleaning the mask and mask stages on line, especially when the lithography system 10 is a EUV lithography system. In the present embodiment, the mask 18 is a reflective mask used in a EUV lithography exposing process for patterning of the integrated circuits with less feature sizes. Since the mask is repeatedly used to pattern a plurality of semiconductor wafers, a defect on the mask may be transferred to the plurality of semiconductor substrates and causes a significant yield issue. Defects including contamination may be introduced to a mask (and further to the mask stage) through various mask handling operations. In some embodiments, the mask handling operations include mask inspection, mask shipping and handling, mask storing, mask transferring, and mask securing on a mask stage. In other embodiments for a reflective mask used in the EUV lithography system, the mask handling operations include manufacturing inspection, shipping and handling, mask cleaning, vacuum storage, transferring to vacuum mask library, pre-alignment and temperature stabilization, and securing on an electrostatic chuck.

In the present embodiment, the cleaning module 26 is operable to clean the mask 18 and/or the mask stage 16 (collectively referred to as to-be-cleaned object or targeted object) inside the lithography system 10, thereby removing and eliminating the particles and other contaminations.

Figure 2:
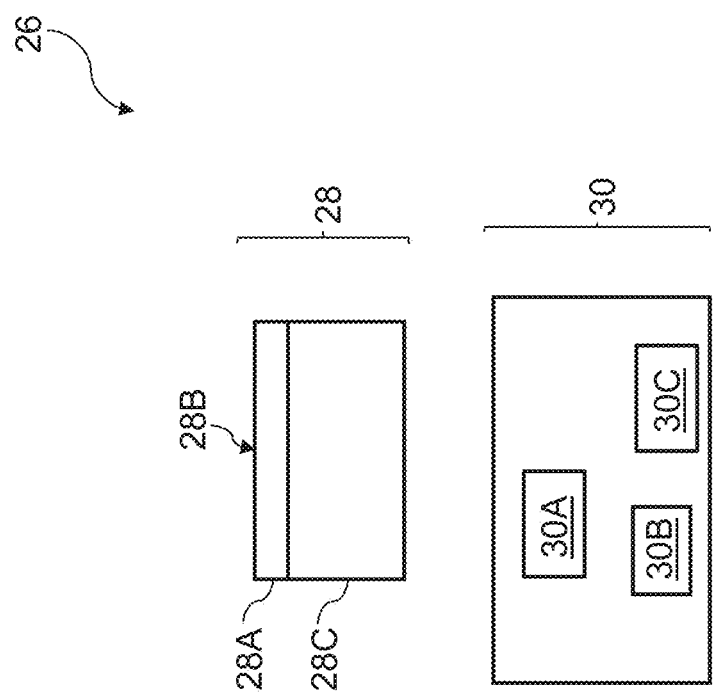
FIG. 2 is a block diagram of the cleaning module, constructed according to various embodiments.

The cleaning module 26 is further illustrated in FIG. 2 in a block diagrammatical view constructed according to some embodiments. The cleaning module 26 includes a cleaning structure 28 using an attraction mechanism to attract and remove particles and other contamination from the targeted object (such as mask or mask stage), therefore reducing or eliminating damage to the mask and/or the mask stage. In one embodiment, the cleaning structure 28 includes an attracting object (cleaning material) 28A, such as a glue material, with a sticking surface 28B such that the particles can be attached to the sticking surface when the sticking surface approaches close to the targeted object. Additionally, a pressure may be applied to the cleaning material to ensure the contact between the cleaning material and the targeted object. In another embodiment, the cleaning structure 28 may include a mechanism, such as electrostatic force, to generate an attracting force to the particles.

The cleaning structure 28 may further include a carrier component 28C, such as a carrier substrate, to secure and support the cleaning material with enough mechanical strength. For example, the carrier substrate may be a suitable plate with the cleaning material attached thereon and with enough mechanical strength to hold the cleaning material for cleaning operations. The carrier substrate is designed to have certain geometry (shape and size) that match those of the targeted object. In one embodiment, the carrier substrate is designed to have a shape and dimensions of the mask 18.

The cleaning module 26 may also include a handling mechanism 30 to secure, transfer, and manipulate (such as apply a pressure) the cleaning structure 28, thereby enabling the cleaning structure 28 for cleaning function. In one embodiment, the handling mechanism 30 includes a robot 30A that is integrated in the lithography system 10 and is configured to be operable to hold and move the cleaning structure 28. The handling mechanism 30 may further include a fixture 30B with a mechanism and a configuration to secure the robot 30A to an apparatus. For example, the robot 30A is secured in a cleaning system by the fixture 30B. In another example, the robot 30A is secured in a lithography exposure system by the fixture 30B with proper configuration to enable the cleaning operations. In another embodiment, the handling mechanism 30 may further include a control unit 30C that is operable to control the robot for various motions and cleaning operations. The control unit 30C may be integrated with the robot 30A or may be distributed in various locations. For example, the control unit 30C is integrated in a lithography exposure system and is coupled with the robot 30A to control cleaning operations.

The cleaning module 26 is further described according to various embodiments. In one embodiment illustrated in FIG. 3, the cleaning structure 28 includes a cleaning material layer 32 with a sticking surface for cleaning the surface of a targeted object 34. The cleaning material layer with the sticking surface is also referred to as sticking material layer. In various examples, the targeting object 34 includes the mask 18, or the mask stage 16. The cleaning material layer 32 is applied to a surface of the targeted object 34 such that various particles 36 are attached to the sticking surface of the cleaning material layer 32, thereby removing the particles 36 from the targeted object 34.

The cleaning material layer 32 may include a suitable material with non-polar chains and polar compound, such as a material with —OH, —H and —O to easily attract particles from the surface of the targeted object 34. The cleaning material is soft without scratch concern. In various embodiments, the cleaning material 32 includes a suitable adhesive tape, polysaccharide, polyvinyl alcohol (PVA) with —OH bond and high chemical polarity, and natural latex (such as gum) with surfactant to modify the stickiness.

One example is further illustrated in FIGS. 4A, 4B and 4C in schematic views. Referring to FIG. 4A, the cleaning material layer 32 is transferred to the targeted object 34. An additional pressure 38 may be further applied to the cleaning material layer 32 to ensure fully contact between the cleaning material layer 32 and the targeted object 34. As noted above, the cleaning material layer 32 may be a portion of the cleaning structure attached to a carrier substrate to provide proper mechanical strength.

Referring to FIG. 4B, the cleaning material layer 32 fully contacts the targeted object 34 in the surface to be cleaned. Especially, the cleaning material layer 32 is designed to be flexible such that the surface profile is changed in response to the surface profile of the targeted object 34. When one or more particle is present on the targeted object 34, the corresponding surface profile of the targeted object 34 is modified with local bumps. The surface profile of the cleaning material layer 32, in response to the local bumps, is substantially complimentary to the surface profile of the targeted object 34. This characteristic of the cleaning material layer 32 is referred to as surface morphological change. Thus, the surface profile of the targeted object 34 is flexible and changeable, and usually is not a smooth when being contacted with the targeted object 34 due to the particles 36 on the targeted object 34. With the surface morphological change of the cleaning material layer 32, the surface profile of the cleaning material layer 32 is changed (e.g., stretching and deforming) under the pressure 38 such that the sticking surface locally surrounds the respective particle, thereby maximizing the contact areas between the particles and the sticking surface. Accordingly the sticking force to the particles (the attaching strength of the particles to the sticking surface) is maximized. The attachment of the particles to the sticking surface may be optimized through tuning the applied pressure 38, the contact duration, and the stickiness of the cleaning material layer 32.

Referring to FIG. 4C, the cleaning material layer 32 is then separated from the targeted object 34. The particles 36 are removed from the targeted object 34 due to Van Der Waal force or Coulomb's force. The separation may be achieved through a liftoff process 40.

FIG. 5 illustrates a schematic view of a cleaning structure 42 constructed according to another embodiment. The cleaning structure 42 includes an electro-static structure with a mechanism to generate electrostatic force. When the cleaning structure 42 approaches close to the targeted object 34, the particles 36 are attracted from the targeted object 34 to the electro-static layer by the electro-static force. In the present example, the cleaning structure 42 includes a current-driven electrostatic mechanism to generate the electrostatic force. In one instance for illustration, the cleaning structure 42 may include a conductive component coupled to a power source and designed to generate electric field in a distribution to effectively attract the particles 36 on the targeted object 34.

Figure 6B:
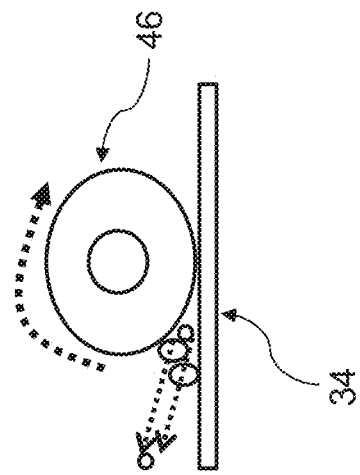
FIGS. 6A and 6B are schematic views of the cleaning module of FIG. 2, constructed according to yet another example.
Figure 6A:
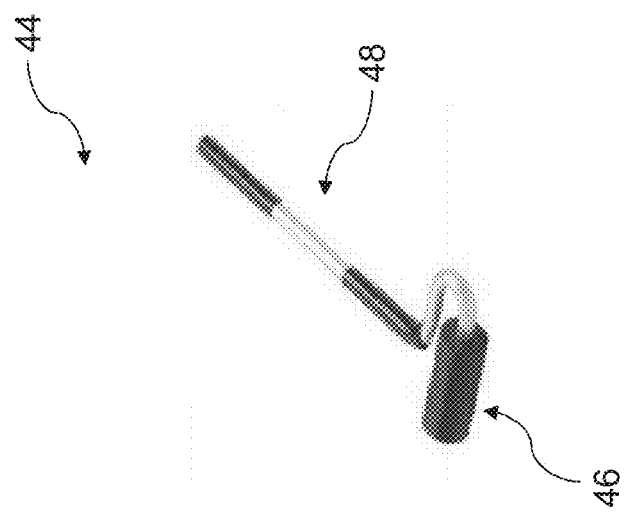

FIG. 6A illustrates a schematic view of a cleaning structure 44 constructed according to another embodiment. The cleaning structure 44 includes a roller 46 having a cylinder shape and being operable to roll. The roller 46 has a sticking material formed on the surface to attract the particles when rolling on the targeted object 34. The cleaning structure 44 further includes a handler 48 integrated with the roller 46 and enabling various operations (such as moving and rolling) of the roller 46.

FIG. 6B illustrates a schematic view of the cleaning process by the cleaning structure 44 according to one example. During the cleaning process, the particles are removed by the roller 46 with rubbing and sticking forces.

Figure 7B:
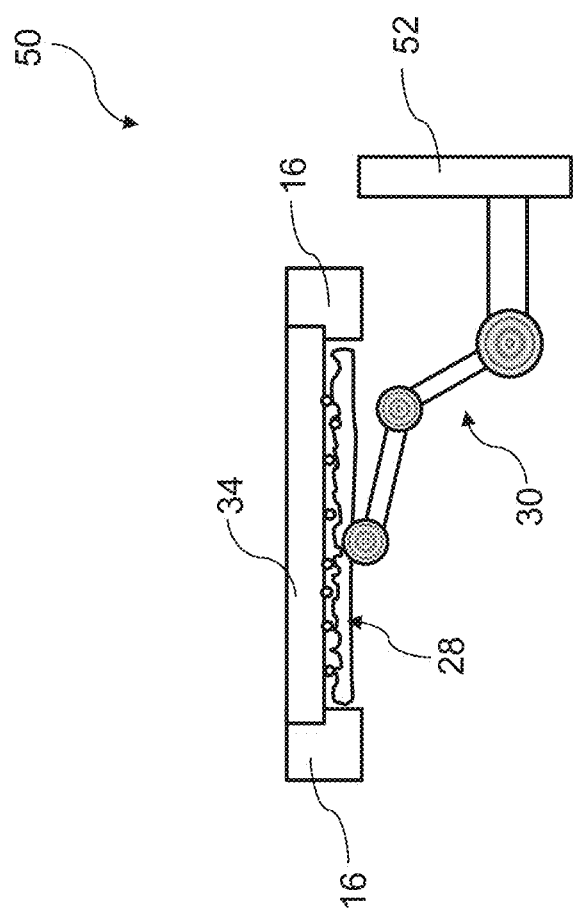

FIG. 7A illustrates a schematic view of a cleaning module 50 constructed according to another embodiment. The cleaning module 50 includes a cleaning structure 28 (such as the cleaning material layer 32 or the cleaning structure 42) and may further include a carrier substrate to provide a mechanical strength. The cleaning module 50 also includes the handing mechanism 30, such as robot, to secure, transfer, and move the cleaning structure 28 for cleaning operations. The handling mechanism 30 is further secured to a component 52 of the lithography system 10 with proper configuration to enable the cleaning operations. In another example, the targeted object 34 is the mask 18 secured on the mask stage 16, as illustrated in FIG. 7B.

FIG. 8A illustrates a schematic view of a portion of the lithography system 10 constructed according to some embodiments. The lithography system 10 includes the mask stage 16 and a chamber 56 with an enclosed space designed to hold various components and features.

In the present embodiment, the chamber 56 includes a mask library 58 to hold various masks. The mask library 58 is also able to hold one or more cleaning structure 28, such as the cleaning structure designed to clean the mask stage 16. As described above, the cleaning structure to clean the mask stage 16 has shape and size to similar to those of the mask 18 and is able to be held in the mask library 58. The chamber 56 includes a mask handler 60, such as a robot, designed to secure and transfer masks. The chamber 56 further includes a cleaning module 62 configured next to the mask library 58 and the mask handler 60. As one example, the cleaning module 62 is designed to clean one or more masks.

The lithography system 10 includes a load lock 64 designed and configured to transfer the mask into and out from the lithography system. The lithography system 10 may include another robot embedded in or integrated with the load lock 64 for mask (or mask container) transferring. This robot works in an atmospheric environment.

Back to the cleaning module 62. The cleaning module 62 may be designed with respective cleaning mechanism, such as one of those described above, including a cleaning material layer, roller and electrostatic cleaning structure.

In one embodiment, the cleaning module 62 is operable to clean the mask before the mask being transferred to the mask stage 16 for a lithography exposing process or after being transferred out from the mask stage 16.

In another embodiment, the mask stage 16 is cleaned during the idle time by the cleaning structure 28 held in the mask library 58 or alternatively the cleaning module 62. In one example, the cleaning structure 28 held in the mask library 58 is used to clean the mask stage 16. In furtherance of the example, the cleaning structure 28 is moved close to the mask stage 16 or is secured onto the mask stage 16. Then a cleaning process is implemented to clean the mask stage 16 by the cleaning structure 28. The cleaning structure 28 is transferred into the mask stage 16 from the mask library 58 and thereafter transferred back to the mask library 58 from the mask stage 16 similar to the way a mask is transferred between the mask stage and the mask library. In various examples, the cleaning structure 28 may be transferred by a robot associated with the mask stage 16, the mask handler 60, or the handling mechanism 30 of the cleaning module 62.

Figure 8B:
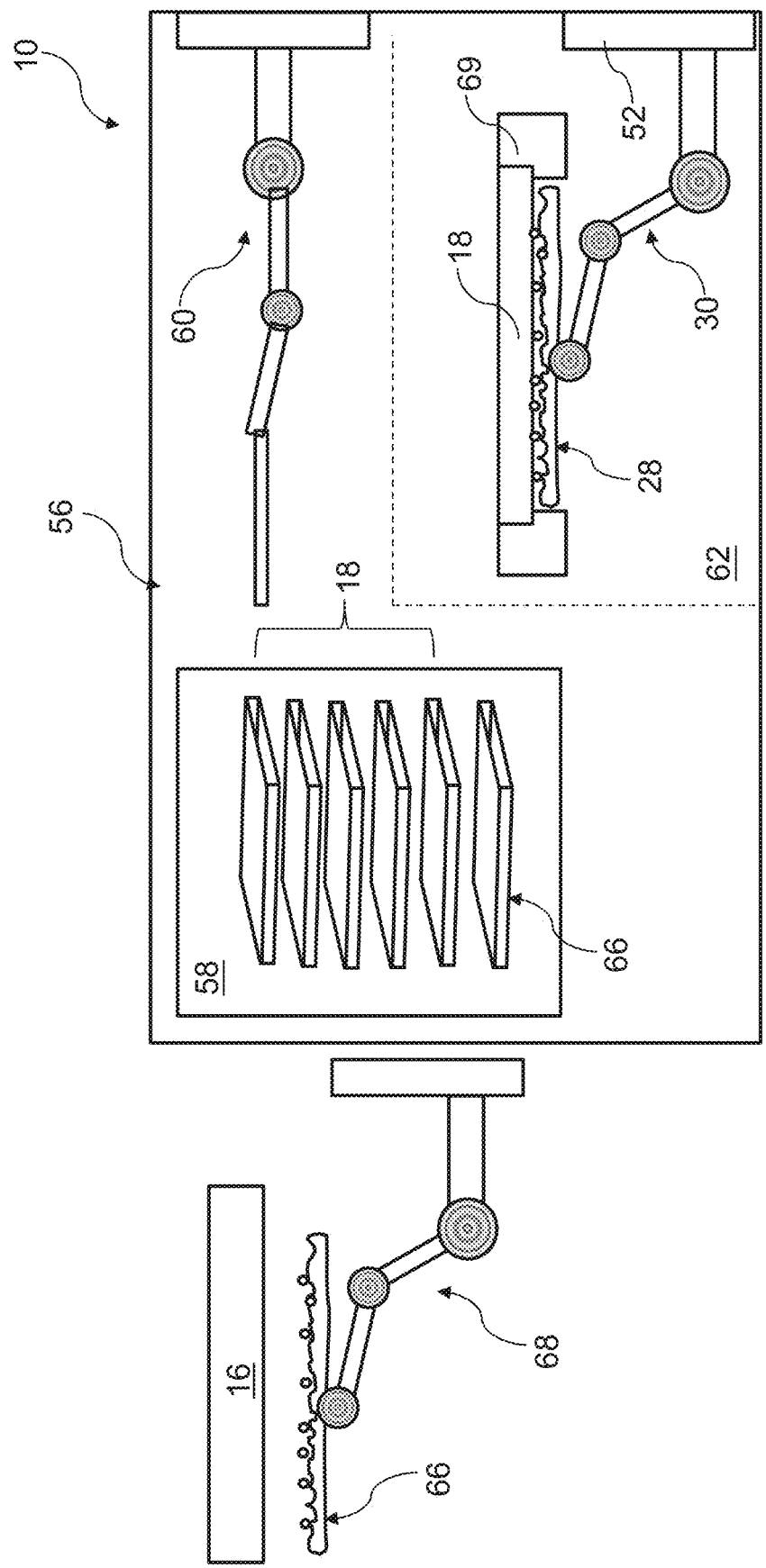

FIG. 8B is a schematic view of the lithography system 10 in portion, constructed according to some other embodiments. The lithography system 10 in FIG. 8B includes a robot chamber 56. The robot chamber 56 further includes a mask library 58, a mask handler 60, and a cleaning module 62.

The mask library 58 is configured to hold one or more masks 18 and a cleaning structure 66 designed to clean the mask stage 16. The cleaning structure 66 has a shape and dimensions of the mask such that it can approach to and additionally be secured on the mask stage 16 for proper cleaning. Furthermore, the cleaning structure 66 has a sticking mechanism, such as one illustrated in FIGS. 4A-4C. In one example, the cleaning structure 66 includes a mask substrate covered by a cleaning material layer with sticking surface. Accordingly, one or more cleaning structure 66 may be stored in the mask library 58.

One embodiment of an operation to clean the mask stage 16 by the cleaning structure 66 is described. During an idle time of the mask stage 16, a robot 68 transfers the cleaning structure 66 from the mask library to the mask stage 16, similar to the transferring of a mask from the mask library to the mask stage. In one example, the cleaning structure 66 is pushed in contact with the mask stage 16. The mask stage 16 is cleaned through a procedure similar to the procedure described in FIGS. 4A through 4C. In another embodiment, the cleaning structure 66 is secured on the mask stage 16 similar to securing a mask. In the present example, the mask stage 16 is an electrostatic chuck designed to secure the cleaning structure 66 by the electrostatic force. The clamping force to the cleaning structure 66 by the mask stage 16 ensures proper contact between the mask stage 16 and the cleaning structure 66. During the time when the cleaning structure 66 is secured on the mask stage 16, the particles on the mask stage 16 is attached to the sticking surface of the cleaning structure 66. Afterward, the robot 68 moves the cleaning structure 66 away from the mask stage 16, the particles on the mask stage 16 are attached to the sticking surface of the cleaning structure 66 and are removed and cleaned from the mask stage 16. Then the cleaning structure 66 is sent back to the mask library 58 by the robot 68.

The mask handler 60 is designed to transfer a mask, such as transferring the mask from the load lock to the mask library 56. The mask handler 60 may include a robot arm for motion and a component to hold the mask.

The cleaning module 62 is designed to clean the masks. The cleaning module 62 is one example of the cleaning module 26 in FIG. 2 and includes the cleaning structure 28 and the handling mechanism 30 (such as a robot) integrated to enable the cleaning operations to the mask 18. In one embodiment, the cleaning module 62 further includes another mask stage 69 configured for mask cleaning. In one example, the mask 18 is transferred from the mask library 56 to the mask stage 69 of the cleaning module 62 by the robot 60. The mask 18 is secured on the mask stage 69 of the cleaning module 62. Then the handling mechanism 30 moves the cleaning structure 28 to the mask 18 secured on the mask stage 69. The cleaning procedure is similar to one of the cleaning mechanism described above, such as the cleaning procedure described in FIGS. 4A through 4C. After the cleaning operation, the mask 18 may be sent back to the mask library 58 by the robot 60.

Figure 9:
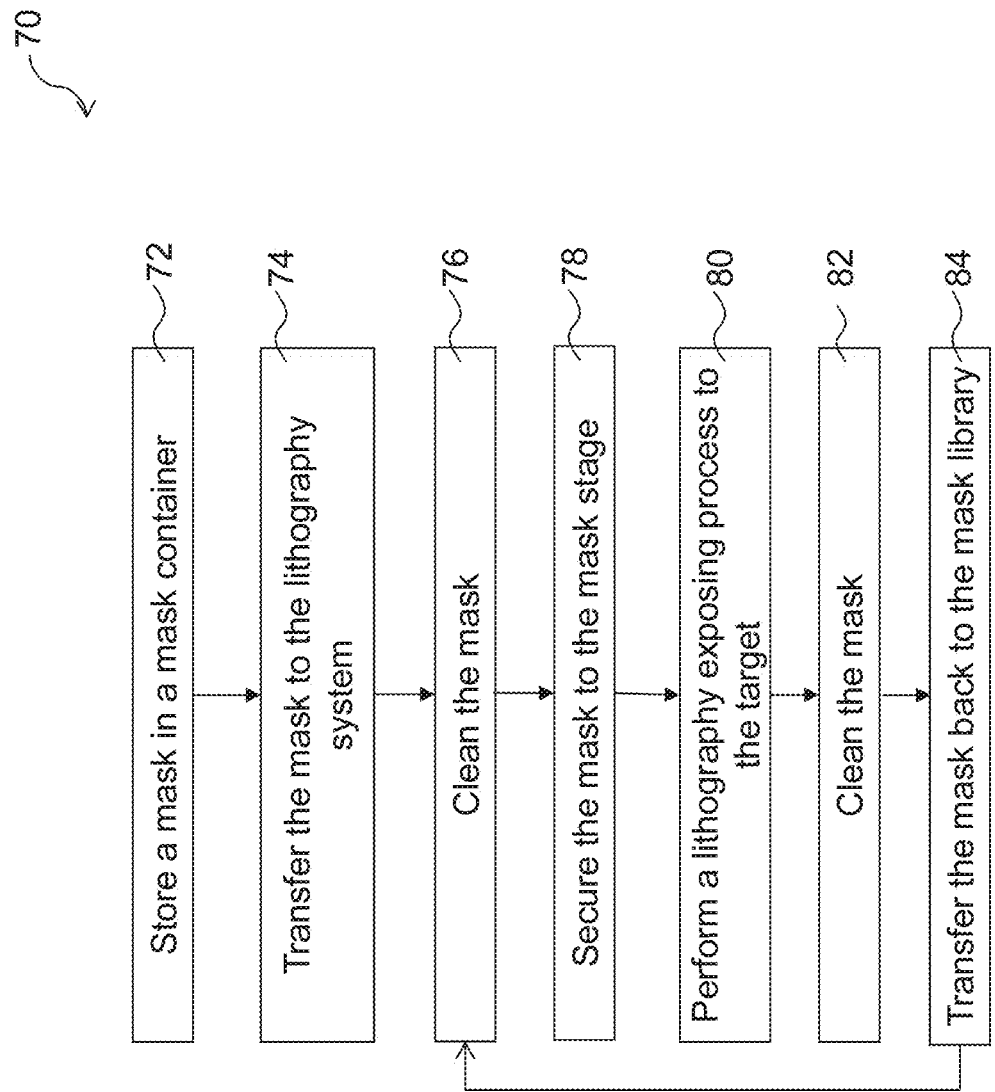
FIG. 9 is a flowchart of a method for performing a lithography exposing process and cleaning a mask, constructed according to one or more embodiments.
Figure 10:
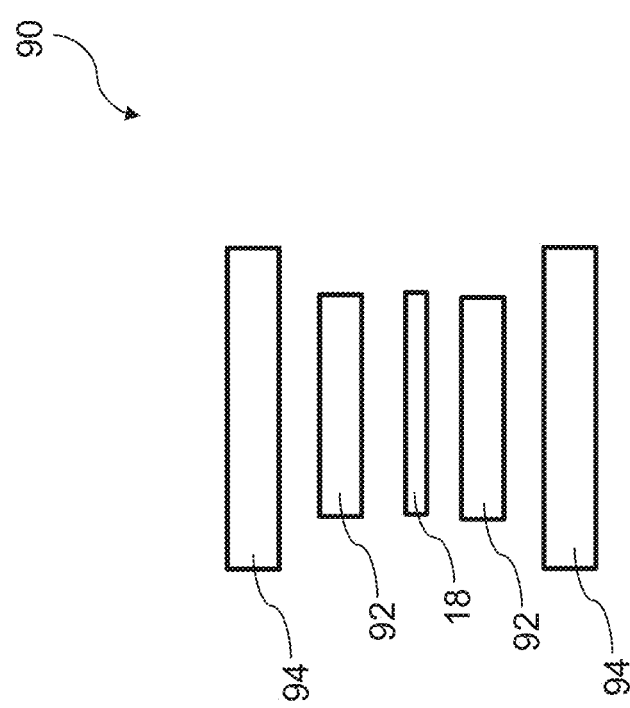
FIG. 10 is a schematic view of a mask container, constructed according to one embodiment.

FIG. 9 is a flowchart of a method 70 to perform a lithography exposing process including mask cleaning by the lithography system 10 constructed according to some embodiments. The method 70 is described with reference to FIGS. 8B, 9 and other relevant figures. Other embodiments of the method 70 may include more or less operations. The method 70 includes an operation 72 by transferring a mask 18 from an outside environment to a mask container, such as a dual pod mask container 90 illustrated in FIG. 10 in a schematic view. The dual pod mask container 90 includes an inner pod 92 and an outer pod 94 configured to hold the mask 18.

The method 70 includes an operation 74 by transferring the mask 18 to the lithography system 10. In the present embodiment, the operation 74 includes placing the mask 18 held in the mask container into the load lock 64 of the lithography system 10, and transferring the mask 18 into the mask library 58. During the operation, the outer pod 94 and the inner pod 92 are removed from the mask 18. After the operation 74, the mask 18 is stored in the mask library 58.

The method 70 includes an operation 76 to clean the mask 18 by the cleaning module 26, such as the cleaning module 62 in the present embodiment. In one example, the mask 18 is transferred out from the mask library 58; cleaned by the cleaning module 62; and thereafter transferred back to the mask library 58. In another example, the mask 18 is transferred out from the mask library 58; cleaned by the cleaning module 62; and thereafter transferred to the mask stage 16 for a lithography exposing process. In this case, the following operation 78 is eliminated.

The method 70 may include an operation 78 by securing the mask 18 to the mask stage 16. For example, the robot 60 may transfer the mask 18 from the mask library 58 to the mask stage 16; the mask 18 is secured on the mask stage 16 by a suitable clamping mechanism, such as electrostatic force.

The method 70 includes an operation 80 by performing a lithography exposing process by the lithography system 10 with the mask 18. The lithography exposing process may further include mask alignment, overlay checking and exposing by the light (such as EUV light) from the radiation source 12. The resist layer coated on the target 22 (that is secured on the substrate stage 24) is exposed to form the latent pattern of an IC pattern on the resist layer.

The method 70 includes an operation 82 to clean the mask 18 by the cleaning module 62. In one example, when the mask 18 is secured on the mask stage 69, the cleaning module 62 performs a cleaning process to the mask 18, such as illustrated in FIG. 8B. In other embodiments, one of the operations 76 and 82 may be eliminated according to the individual situation including the contamination level and criticality of the IC pattern defined on the mask 18.

The method 70 includes an operation 84 by transfer the mask 18 back to the mask library 58 after the cleaning process at the operation 82. In various embodiments, the operations 76 through 84 may be repeated during the processes to pattern various targets. In one example, the mask 18 is repeated through the operations 76-84 to pattern a plurality of semiconductor wafers (a batch of wafers in this example). In another example, a first mask goes through the operations 76-84 to a first batch of wafers; a second mask goes through the operations 76-84 to pattern a second batch of wafers; and so on.

Figure 11:
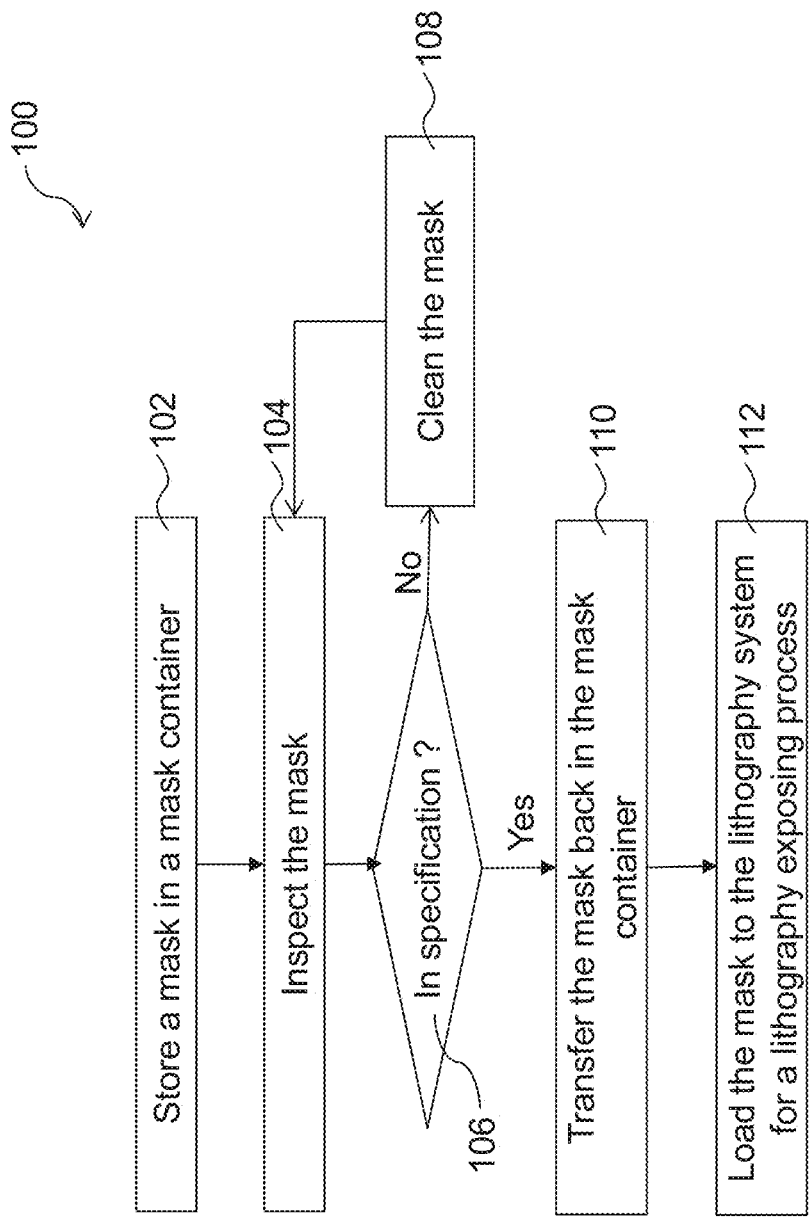
FIG. 11 is a flowchart of a method for cleaning a mask, constructed according to other embodiments.

FIG. 11 is a flowchart of a method 100 to perform a cleaning process constructed according to some other embodiments. The method 100 begins at 102 that a mask 18 is stored in a mask container, such as a dual pod mask container 90 in FIG. 10.

The method 100 includes an operation 104 by performing a mask inspection to the mask 18. In one embodiment, the mask inspection includes inspecting the front side and the backside of the mask 18. A mask inspection system, such as a metrology tool with light scattering mechanism, is used to inspect the mask for particles. In one embodiment, a previous inspection data may be used as a reference. For example, the inspection data to a defect-free mask 18 is used as a reference. The comparison between the inspection data and the reference data will provide particle information, such as particle locations and sizes. In one example, the mask 18 in the mask container is loaded to the mask inspection system, inspected and unloaded.

At 106, the inspection result is evaluated according to a certain criteria, such as specification associated with the lithography system, which is used to perform the lithography exposing process with the mask 18. An exemplary specification, associated with the lithography system, is provided for illustration. The exemplary specification includes: a number of particles with size greater than 50 micron is 0; a number of particles with size greater than 10 micron is less than 35; and a number of particles with size greater than 3 micron is less than 70. Here the numbers are counted per mask.

If the inspection result is out of the specification, the method 100 proceeds to operation 108 by performing a cleaning process to the mask 18. The cleaning process utilizes the cleaning module 26 to remove the particles through a suitable mechanism, such as one illustrated in FIGS. 4A though 4C. Thereafter, the mask 18 is back to the operation 104 for another mask inspection. In the present embodiment, the cleaning module 26 is a standalone module such that the cleaning process is implemented before the mask is loaded to the lithography system 10.

When the inspection result is evaluated to be in the specification at 106, the method 100 proceeds to an operation 110 by placing the mask 18 back in the mask container.

By implementing various operations of the method 100, the mask 18 is maintained in the mask container with reduced contamination and ensured mask quality.

The method 100 may further include an operation 112 by loading the mask 18 to a lithography system and performing a lithography exposing process to one or more wafers using the mask 18. In the present embodiment, the lithography system is the lithography system 10, as illustrated in FIGS. 1 and 8. In one example, the operation 112 includes placing the mask 18 held in the mask container into the load lock 64 of the lithography system 10, transferring the mask 18 into the mask state 16, and performing a lithography exposing process to image the IC pattern of the mask 18 to a resist layer coated on the semiconductor wafer. In another example, the procedure including the operations 74 through 84 in the method 70 may be implemented to perform one or more exposing processes with the mask 18.

FIG. 12 is a flowchart of a method 120 for cleaning the mask stage 16 by the cleaning structure 66, constructed according to some embodiments. The method 120 is described with reference to FIG. 12, FIG. 8B and other figures. The method 120 begins at operation 122 by storing the cleaning structure 66 in the mask library 58. The method 120 proceeds to an operation 124 by securing the cleaning structure 66 to the mask stage 16. The operation 124 further includes transferring the cleaning structure 66 from the mask library 58 to the mask stage 16 before the cleaning structure 66 is secured on the mask stage 16. The method 120 further includes an operation 126 to clean the mask stage 16 by the cleaning structure 66. During the cleaning operation 126, suitable pressure and cleaning duration are implemented. The pressure between the mask stage 16 and the cleaning structure 66 is maintained to ensure the contact and attachment of the particles to the sticking surface of the cleaning structure 66. The cleaning duration is tuned to be sufficient for the articles to be attached to the sticking surface of the cleaning structure 66. The method 120 may further include transferring the cleaning structure 66 back to the mask library 58.

FIG. 13 is a flowchart of a method 130 for cleaning the mask stage 16 by the cleaning structure 66, constructed according to some other embodiments. The method 130 is described with reference to FIG. 13, FIG. 8B and other figures. The method 130 begins at operation 132 by storing the cleaning structure 66 in the mask library 58. The method 130 proceeds to an operation 134 by transferring the cleaning structure 66 from the mask library 58 to the mask stage 16. The method 130 further includes an operation 136 to clean the mask stage 16 by the cleaning structure 66. In one embodiment, a suitable pressure is applied to the cleaning structure 66 to ensure the contact between the mask stage 16 and the cleaning structure 66. In another embodiment where the cleaning structure 66 utilizes the electrostatic mechanism for cleaning, the cleaning structure 66 approaches close to the mask stage 16 but may not be in direct contact with the mask stage 16. The method 130 may further include transferring the cleaning structure 66 back to the mask library 58.

The lithography system with embedded cleaning module and the method for utilizing the lithography system to clean mask and/or mask stage are described in various embodiments. The cleaning module includes a cleaning structure and a handling mechanism to manipulate the cleaning structure for cleaning. In one embodiment, the cleaning module provides an attraction mechanism that manipulates an adhesive surface to touch the surface of mask (or mask stage), thereby attracting nano-particles or macro-particles from the mask (or mask stage). In another embodiment, the cleaning module includes a current-driven electrostatic mechanism to clean the mask (or the mask stage). In yet another embodiment, a cleaning structure includes a mask substrate (alternatively a plate similar to the mask in shape and dimensions) attached with a cleaning material layer such that the cleaning structure can be properly handled, like handling a mask, to clean the mask stage.

Other embodiments or alternatives may present without departure of the present disclosure. In one embodiment, the lithography system 10 includes two or more cleaning modules embedded in the lithography system: a first cleaning module designed to clean a mask and a second cleaning module designed to clean a mask stage of the lithography system. In furtherance of the embodiment, the first cleaning module includes a first cleaning structure and a handling mechanism to secure and manipulate the first cleaning structure. The second cleaning module includes a second cleaning structure that further includes a carrier substrate and an attracting material layer attached to the carrier substrate. Furthermore, the carrier substrate has a shape and dimensions of the mask such that the cleaning structure is able to approach the mask stage or be secured on the mask stage for cleaning operation. In another embodiment, the cleaning module 26 may alternatively stand alone, such as the cleaning module used in the method 100 of FIG. 11.

Various advantages may present in one or more different embodiments of the present disclosure. The advantages, in various embodiments, include low-cost, pattern damage free of the front-side of the mask, effectively removing particles, simple operation, embedded in scanner, superior capability to remove nano-scale particle compared to other traditional approach. Compared to wet-cleaning process, this approach allows exactly control over the cleaning sites on the mask; therefore, the unnecessary cleaning site like front-side with pattern can be avoided to eliminate the damage. Furthermore, the cleaning structure and the cleaning method can be tuned as effective as possible with optimized modification of adhesive surface.

Thus, the present disclosure provides a lithography system in some embodiments. The lithography system includes an exposing module configured to perform a lithography exposing process using a mask secured on a mask stage; and a cleaning module integrated in the exposing module and designed to clean at least one of the mask and the mask stage using an attraction mechanism.

The present disclosure provides a lithography system in other embodiments. The lithography system includes an exposing module designed to perform a lithography exposing process and configured in an enclosed chamber maintained in a vacuum environment; and a cleaning module integrated with the exposing module. The cleaning module includes a cleaning structure with an attraction mechanism to remove particles and a handling mechanism that is designed to secure and transfer the cleaning structure.

The present disclosure provides a method that includes loading a mask into a lithography system designed to perform a lithography exposing process, the lithography system being embedded with a cleaning module having an attraction mechanism; securing the mask to a mask stage; performing a lithography exposing process by the lithography system to a semiconductor wafer using the mask; and cleaning the mask by the cleaning module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
one or more masks;
a mask library that is configured to store the one or more masks, wherein the mask library is integrated within a chamber;
a mask stage configured to secure the one or more masks thereon;
a first cleaning structure that is located within the chamber and configured to remove contaminant particles from a surface of the one or more masks using a sticking material or using an electrostatic force generated by a current-driven electrostatic force generator, wherein a shape and a dimension of the first cleaning structure are configured such that the first cleaning structure is capable of being stored in the mask library within the chamber; and
a second cleaning structure that is different from the first cleaning structure, wherein the second cleaning structure is located outside the chamber and directly attached to an external wall of the chamber via a robotic arm, and wherein the second cleaning structure is configured to remove contaminant particles from a surface of the mask stage using the sticking material or using the electrostatic force.

2. The system of claim 1, wherein the first cleaning structure has a same shape and dimensions as at least one mask of the one or more masks.

3. The system of claim 2, wherein a shape and a dimension of the first cleaning structure are configured such that the first cleaning structure is capable of being secured on the mask stage.

4. The system of claim 1, further including:
a first mask handler that is located within the chamber and configured to transfer the one or more masks within the chamber and apply a pressure on the first cleaning structure as the first cleaning structure is in contact with the surface of the one or more masks; and
a second mask handler that is located outside the chamber and configured to transfer the second cleaning structure in and out of the chamber and apply a pressure on the second cleaning structure as the second cleaning structure is in contact with the surface of the mask stage.

5. The system of claim 1, wherein the sticking material includes non-polar chains.

6. The system of claim 1, wherein the sticking material includes a polar compound.

7. The system of claim 1, wherein the sticking material includes a material with —OH, —H, and —O.

8. The system of claim 1, wherein the sticking material includes polysaccharide.

9. The system of claim 1, wherein the sticking material includes polyvinyl alcohol with —OH bond.

10. The system of claim 1, wherein the sticking material includes natural latex with a surfactant.

11. The system of claim 1, wherein the sticking material is flexible such that a surface profile of the sticking material is substantially complementary to a surface profile of the one or more masks or the mask stage when the first cleaning structure is in contact with the one or more masks or as the second cleaning structure is in contact with the mask stage.

12. The system of claim 1, wherein the first cleaning structure or the second cleaning structure includes a roller having a cylinder shape and a handler that is configured to move the roller.

13. A chamber of a semiconductor fabrication system, comprising:
 a plurality of extreme ultraviolet (EUV) lithography masks;
 a mask library configured to store the EUV lithography masks;
 a mask handler configured to transfer the EUV lithography masks;
 a mask stage configured to secure at least one of the EUV lithography masks thereon; and
 a first cleaning module that resides within the chamber and contains a first attraction mechanism to clean the EUV lithography masks, wherein the first cleaning module is attached to an interior surface of the chamber via a first robotic arm;
 a second cleaning module that resides outside the chamber and contains a second attraction mechanism to clean the mask stage, wherein the second cleaning module is directly attached to an external surface of the chamber via a second robotic arm;
 wherein:
 the first attraction mechanism and the second attraction mechanism each includes a sticking material or a current-driven electrostatic force generator and attracts contaminant particles from surfaces of the EUV masks or the mask stage; and
 a surface of the first or second attraction mechanism and a surface of at least one of the EUV masks have substantially identical shapes and dimensions, such that the first cleaning module is configured to be stored in the mask library along with the plurality of EUV masks inside the chamber, transferred by the mask handler within the chamber or into or out of the chamber, and secured by the mask stage.

14. The chamber of claim 13, wherein the first or second attraction mechanism includes: non-polar chains, a polar compound, polysaccharide, polyvinyl alcohol with —OH bond, a natural latex with a surfactant, or a material with —OH, —H, and —O.

15. The chamber of claim 13, wherein a surface profile of the first or second attraction mechanism is substantially complementary to a surface profile of the EUV mask or the mask stage that is in contact with the first or second attraction mechanism as the EUV lithography masks or the mask stage are cleaned.

16. The chamber of claim 13, wherein: the sticking material includes non-polar chains and a polar compound.

17. A method, comprising:
 retrieving, from a mask library in a chamber of a lithography system, a first cleaning structure that includes a first attraction mechanism that includes a sticking material or a current-driven electrostatic force generator, wherein the first cleaning structure has substantially shapes and dimensions as a mask that is configured to be stored in the mask library;
 using the first attraction mechanism of the first cleaning structure to remove contaminant particles from a surface of the mask while the first cleaning structure and the mask are located inside the chamber;
 providing a second cleaning structure that is located outside the chamber and that is different from the first cleaning structure, wherein the second cleaning structure is mechanically and directly coupled to an exterior wall of the chamber through a robotic arm, wherein the second cleaning structure includes a second attraction mechanism that includes the sticking material or the current-driven electrostatic force generator, and wherein the first cleaning structure and the second cleaning structure are provided simultaneously;
 using the second attraction mechanism of the second cleaning structure to remove contaminant particles from a surface of a mask stage while the second cleaning structure and the masks stage are located outside the chamber; and
 performing a lithography process using the mask or the mask stage.

18. The method of claim 17, wherein the first or second attraction mechanism is used to remove the contaminant particles before the lithography process is performed and after the lithography process is performed.

19. The method of claim 17, wherein the using the first or second attraction mechanism to remove contaminant particles comprises using a material that includes non-polar chains and a polar compound to remove the contaminant particles.

20. The method of claim 17, wherein the using the second attraction mechanism to remove contaminant particles from the surface of the mask stage is performed during an idle time of the mask stage.

* * * * *